United States Patent
Shah et al.

(10) Patent No.: US 8,829,903 B2
(45) Date of Patent: Sep. 9, 2014

(54) METHOD AND APPARATUS FOR CHARACTERIZING AND OPTIMIZING AN RF COIL IN A MAGNETIC RESONANCE IMAGING SYSTEM

(75) Inventors: Bijay Kamleshbhai Shah, Brookfield, WI (US); Eddy Benjamin Boskamp, Pewaukee, WI (US); Ricardo Becerra, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 318 days.

(21) Appl. No.: 13/315,388

(22) Filed: Dec. 9, 2011

(65) Prior Publication Data
US 2013/0147484 A1    Jun. 13, 2013

(51) Int. Cl.
*G01V 3/00*    (2006.01)
(52) U.S. Cl.
USPC ............................ 324/314; 324/318; 324/322
(58) Field of Classification Search
USPC .................... 324/314, 318, 322, 307, 309
See application file for complete search history.

(56) References Cited

U.S. PATENT DOCUMENTS

| | | | |
|---|---|---|---|
| 5,483,158 A | 1/1996 | van Heteren et al. | |
| 5,610,520 A * | 3/1997 | Misic | 324/318 |
| 6,223,065 B1 * | 4/2001 | Misic et al. | 600/410 |
| 7,135,864 B1 | 11/2006 | McKinnon et al. | |
| 7,221,162 B2 * | 5/2007 | Feiweier et al. | 324/318 |
| 8,319,495 B1 * | 11/2012 | Zhu | 324/307 |

* cited by examiner

*Primary Examiner* — Louis Arana
(74) *Attorney, Agent, or Firm* — Ziolkowski Patent Solutions Group, SC

(57) ABSTRACT

An MRI apparatus includes a magnetic resonance imaging (MRI) system having a plurality of gradient coils positioned about a bore of a magnet, an RF coil assembly having at least a first port and a second port, an RF transceiver system having a pulse module and configured to transmit RF signals to the first port and the second port, and a computer programmed to drive the RF coil assembly in quadrature through the at least first port and the second port, measure a $B_1$ field using at least one flux probe at two or more angular orientations within the RF coil assembly, and characterize and optimize performance of the MRI system based on the measurements of the $B_1$ field.

21 Claims, 5 Drawing Sheets

METHOD AND APPARATUS FOR CHARACTERIZING AND OPTIMIZING AN RF COIL IN A MAGNETIC RESONANCE IMAGING SYSTEM

BACKGROUND OF THE INVENTION

Embodiments of the invention relate generally to a method of calibrating an MRI system and more specifically for calibrating an RF coil when positioned within the MRI system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

MR systems typically include radio-frequency (RF) transmit coils that are used to transmit electromagnetic waves into a sample, creating the $B_1$ magnetic field needed to excite nuclear spins. Receive coils detect the signal emitted by the nuclear spins as they precess in the $B_1$ field. The same coil may be used for both exciting spins and receiving the resulting excitation signal, or transmission and reception may be performed by separate coils which are constructed to minimize coupling therebetween.

Various types of coils include for instance solenoidal coils to generate an RF magnetic field ($B_1$ field), surface coils and phased arrays, and volume resonators. In the case of a volume resonator, a variety of types are available that may be defined as cylindrical, multi-loop coils which generate the $B_1$ field perpendicular to the bore axis. A birdcage coil is commonly used as a head or a body coil, and can be used in both transmit-receive and transmit-only configurations. The birdcage coil can be operated in quadrature mode in order to reduce power and also to achieve an increase in $B_1$ field strength and detection sensitivity (in, for instance, a transmit-receive configuration). It is well known that in free space, a quadrature operated volume birdcage coil produces and receives a circularly polarized $B_1$ field. For lossy objects with a relative permittivity similar to water and circular in cross-section and at a frequency at which the wavelength is comparable to the human body, the $B_1$ field may only be truly circularly polarized over a small region at the center. Nevertheless, for a circular cross-sectioned object, a circularly polarized $B_1$ field is considered the most efficient in terms of $B_1$ field generated for a given amount of power.

In transmission mode, the driving current is split into two signals which are applied to the birdcage coil in order to create, theoretically, a circularly polarized field using sinusoidal currents of equal magnitude that are 90° out of phase. That is, one field is driven sinusoidally in-phase (i.e., the I port), and the second field is driven sinusoidally in quadrature (i.e., the Q port). The fields add as vectors in quadrature, with the final $B_1$ field oriented perpendicularly to the bore axis. In reception mode, a birdcage coil simultaneously detects components of $B_1$ along two orthogonal directions, yielding two separate electrical signals. As such, theoretically at least, a circularly polarized $B_1$ field may be generated from operation of the I and Q ports in quadrature and having the same amplitude and being 90° out of phase. However, as will be described, a circularly polarized $B_1$ field may not be achieved due to the presence of a body being imaged and may not be achieved due to variations in components that are used to fabricate the MR system.

During manufacture, coils may have a varying capacitance as a function of angle within the coil for a number of reasons including but not limited, such as if the coil is formed out-of-round, the coil shield is out-of-round, or if the antenna (rung and endring) to shield distance varies as a function of location. This variation may be due to variability of components themselves (i.e., capacitors, cable lengths, etc. . . . ) and to variations in component dimensions during the manufacturing process, as examples. Thus, even though a coil may be fabricated to exacting tolerances and with components having very tight specifications, coil variation nevertheless may occur due to a cumulative effect of all the components of the coil. Such variation manifests itself as a non-uniform coil capacitance as a function of angle within the coil which, at system level and during MR operation, results in a non-uniform and typically elliptical field when driven in quadrature from the I and Q ports.

Methods have been developed in order to correct for the capacitance variation of the coil as a function of angle. For instance, one known method of tuning a birdcage coil (i.e., with a rung and endring) includes measuring the coil and adjusting the capacitance thereof prior to installation into the MR system. In this example, two flux probe are used wherein the first flux probe is used to excite the birdcage coil and the second flux probe is used to measure the B1 field. Using the two flux probes, coil tuning is measured for a number of angular orientation and the coil capacitance may be changed to tune the coil using known methods (i.e. replacing individual capacitors about the coil). For lower $B_1$ field systems, such as 1.5 T or below, such tuning generally proves to be adequate.

Also, in a higher $B_1$ fields, at or above 3T for instance, the wavelength is short and can interact with the wavelength of a body being imaged. As such, the $B_1$ field combines with the wavelength of the body, leading to an inhomogeneous $B_1$ field when the wavelength in the body is comparable to the body being imaged, that can manifest itself as shading in a final image. This is known as the "dielectric effect," which can be compensated for by driving the coil in an elliptical mode in order to compensate for this effect and reduce the shading. That is, the I and Q ports can be driven having either their phases shifted (different from 90°) out of phase from one another, their magnitudes varied from one another, or both. This results in an elliptical polarization with precise orientation and strength that minimizes the $B_1$ inhomogeneity within the imaged object. Thus, by knowing the effect of the body, phases and magnitudes of ports I and Q can be selectively driven in order to compensate for and minimize the dielectric effect.

As such, known MR systems include coils that can be tuned at the coil level, and known MR systems may also correct for the dielectric effect by driving an elliptical polarization, as discussed. However, one factor that is not accounted for in known systems is the system level interaction of the coil with other components once the $B_1$ field generator, such as a birdcage, is installed into the system. Once the birdcage coil is electrically connected to the rest of the system overall capacitance is affected despite having a coil that has been tuned at the coil level. And, although not negligible the system level effect is sufficiently small for systems having a lower $B_1$ field strength, such as below 1.5 T. As such, known systems having a birdcage coil may successfully operate using a tuned coil and using an elliptically driven polarization to correct for the shading caused by the dielectric effect. Such operation, though, is inherently based on an assumption that connecting the coil to the system did not affect overall capacitance.

As $B_1$ field strength is increased to a field strength such as 3 Tesla, however, the phenomenon known as the dielectric effect becomes more of a problem. That is, for high $B_1$ field strength the problem is exacerbated and shading as a result of the dielectric effect can be more pronounced, resulting in a larger needed polarization ellipticity. And, although known algorithms may include phase and/or magnitude shifts to compensate for the dielectric effect, such compensation is nevertheless based on an assumption that the $B_1$ field is uniform to begin with. Thus, compensation for the dielectric effect may have only limited benefits if the beginning assumption of $B_1$ field uniformity is not correct.

Thus, the effect of system-to-system $B_1$ field non-uniformity may be small at 1.5 T, and an assumption of $B_1$ field uniformity along with elliptical drive compensation for the dielectric effect is typically adequate to avoid shading. However, at higher $B_1$ field strength, such as at 3 T or above, such assumptions can fall apart, leading to shading and a need to reduce system to system variation once the $B_1$ field generator is installed into the system.

It would therefore be desirable to have a system and method capable of compensating for unit-to-unit variation and tuning a $B_1$ field of a coil for a system driven in quadrature.

BRIEF DESCRIPTION OF THE INVENTION

Embodiments of the invention provide a system and method of characterizing performance of an MRI system based on measurements of a $B_1$ field.

In accordance with one aspect of the invention, an MRI apparatus includes a magnetic resonance imaging (MRI) system having a plurality of gradient coils positioned about a bore of a magnet, an RF coil assembly having at least a first port and a second port, an RF transceiver system having a pulse module and configured to transmit RF signals to the first port and the second port, and a computer programmed to drive the RF coil assembly in quadrature through the at least first port and the second port, measure a $B_1$ field using at least one flux probe at two or more angular orientations within the RF coil assembly, and characterize and optimize performance of the MRI system based on the measurements of the $B_1$ field.

In accordance with another aspect of the invention, a method of characterizing and optimizing an RF coil for an MRI apparatus includes driving an RF coil assembly in quadrature, positioning one or more flux probes within the RF coil assembly, measuring a $B_1$ field of the RF coil assembly at two or more angular positions of the one or more flux probes within the RF coil assembly, and characterizing and optimizing performance of an MRI apparatus based on the measurements of the $B_1$ field of the RF coil assembly at the two or more rotational positions of the flux probe.

In accordance with yet another aspect of the invention a non-transitory computer readable storage medium having stored thereon a computer program comprising instructions which when executed by a computer cause the computer to cause an RF transmitter to emit a magnetic field in quadrature from two ports of an RF coil assembly that is positioned within an MRI apparatus, obtain $B_1$ field data of the RF coil assembly from a flux probe that is positioned within the RF coil assembly at two or more angular positions of the flux probe, and determine a set of correction parameters for the MRI apparatus based on the obtained $B_1$ field data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
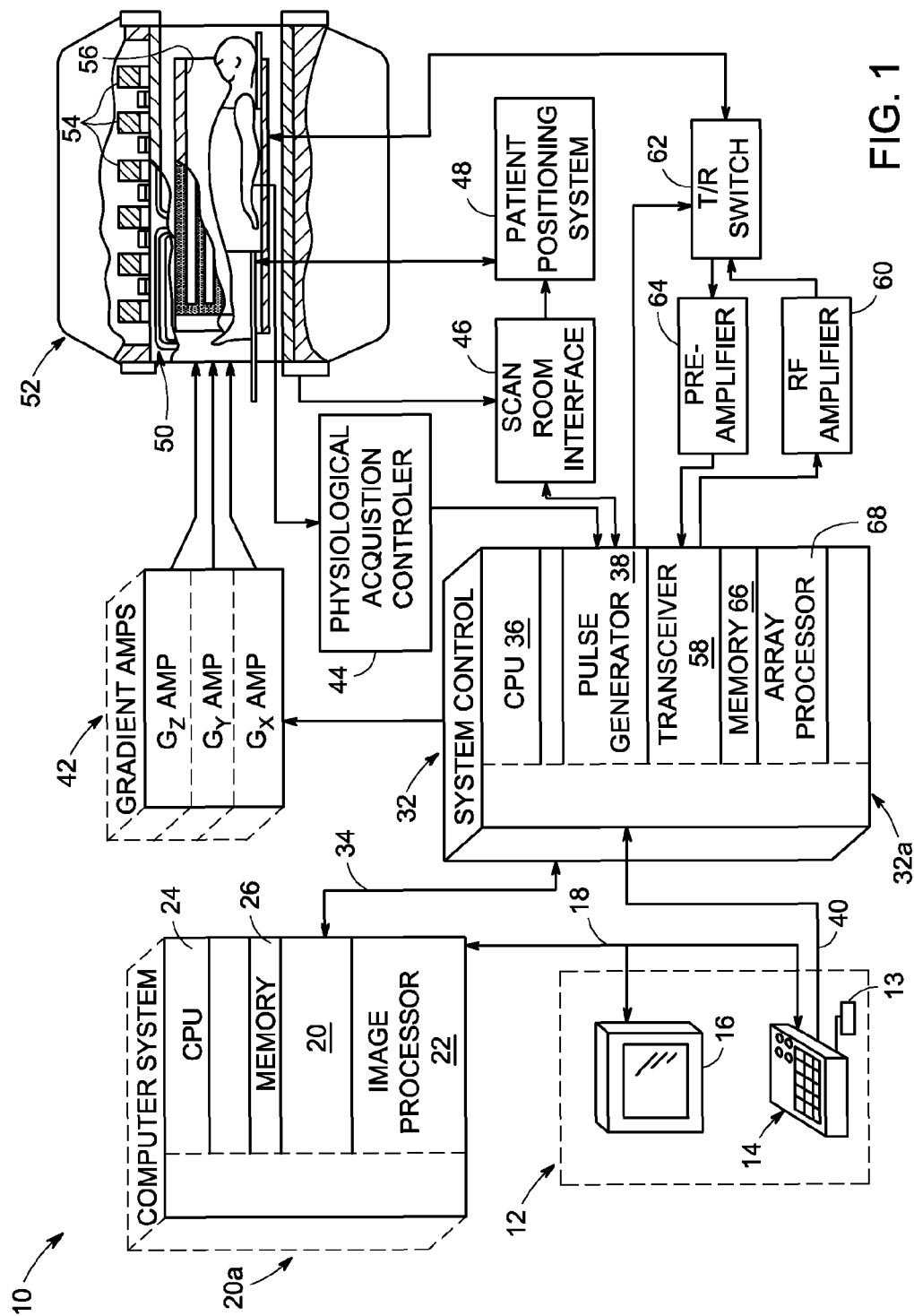
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

The present invention is directed to an MR imaging technique of correcting an excitation field to compensate for variations in a $B_1$ field in an MR system, such as the MR system illustrated in FIG. 1, or equivalents thereof. Specifically, the invention will be described with respect to generating an elliptical $B_1$ field based on measurements of a system to compensate for system to system variances and to compensate for system parameters that cause a nonuniform $B_1$ field, however, one skilled in the art will appreciate that $B_1$ fields of other shapes are contemplated.

An ellipse is defined as the locus of points for which the sum of the distances from each point to two fixed points is equal. An ellipse has a major axis passing through the two fixed points that is the longest segment that passes through the ellipse. A minor axis orthogonally bisects the major axis and is the shortest segment that passes through the ellipse. A circle is defined as a locus of points for which the distance from each point to a single fixed point is equal. While a circle may be characterized by the definition of an ellipse where the two fixed points are identical, as used herein, an ellipse does not refer to a circle. Rather, an ellipse as used herein refers to a shape defined by the definition of an ellipse having two separate, fixed points. For an imaging object having a substantially elliptical cross-section, a generally elliptical $B_1$ polarization field improves transmit efficiency over a circular $B_1$ polarization field.

Figure 2:
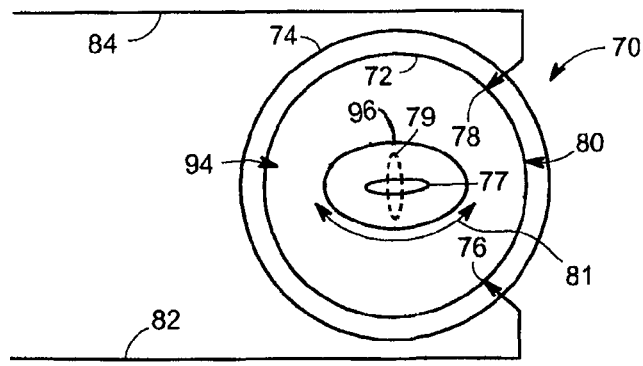
FIG. 2 shows an RF coil assembly according to one embodiment.

FIG. 2 shows an RF coil assembly 70 having incorporated therein one embodiment of the present invention. RF coil assembly 70 includes an end ring 72 and a shield 74. Preferably, RF coil assembly 70 is driven at two drive ports, or feed points, 76, 78 (commonly referred to respectively as the in-phase "I" and quadrature "Q" ports) around a circumference 80 thereof spaced apart by 90 degrees. In a preferred embodiment, RF coil assembly 70 is a highpass, lowpass, hybrid, or transverse electromagnetic (TEM) birdcage coil. However other types of RF coils are contemplated. Also, RF coil assembly 70 preferably has a circular arrangement. However an elliptical or other arrangement may be used. With the drive points 76, 78 spaced 90 degrees apart, there is a high level of isolation therebetween. As such, the drive points 76, 78 are treated as two separate and independent drive channels 82, 84. Each channel 82, 84 may be driven at a single drive point 76, 78, respectively, on the circumference 80 of end ring 72 of RF coil assembly 70 as shown in FIG. 2.

Figure 3:
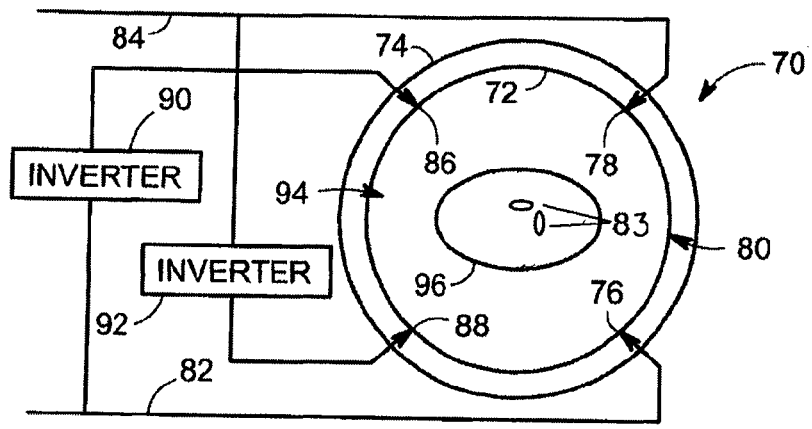
FIG. 3 shows an RF coil assembly according to one embodiment.

As shown in FIG. 3, however, in another embodiment, channel 82 may be driven at two drive points 76, 86 spaced 180 degrees apart, and channel 84 may be driven at two drive points 78, 88 spaced 180 degrees apart. When channels 82, 84 are each driven using two drive points 76, 86 and 78, 88, respectively, the signals at drive points 76, 86 are in anti-phase to each other, and the signals at drive points 78, 88 are in anti-phase to each other. That is, channel 82 includes a signal inverter 90 such that there is a 180 degree phase difference between signals applied to drive points 76 and 86. Similarly, channel 84 includes a signal inverter 92 such that there is a 180 degree phase difference between signals applied to drive points 78 and 88.

Figure 4:
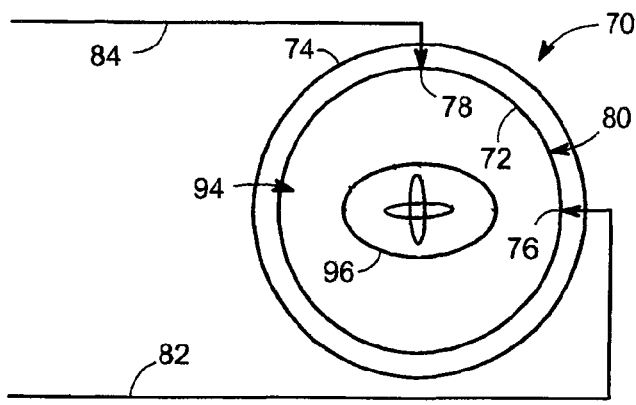
FIG. 4 shows an RF coil assembly according to one embodiment.

In either embodiment of FIGS. 2 and 3, channels 82 and 84 are driven to generate a $B_1$ polarization within a volume-of-interest 94. If drive points 76 and 78 are at +45 degrees and −45 degrees with respect to the horizontal, respectively and as an example, then circular polarization can be achieved by driving channels 82, 84 with signals having the same amplitude with a phase shift of 90 degrees therebetween. Horizontal, linear polarization can be achieved with equal amplitude signals and a phase shift of 0 degrees between channels 82, 84. Vertical, linear polarization can be achieved with equal amplitude signals and a phase shift of 180 degrees between channels 82, 84. Alternatively, as shown in FIG. 4, if drive points 76, 78 are at 0 degrees and 90 degrees with respect to the horizontal, respectively, then horizontal, linear polarization can be achieved with a full signal in channel 82 and zero signal in channel 84. Similarly, vertical, linear polarization can be achieved with a full signal in channel 84 and zero signal in channel 82.

Thus, by appropriate control of the amplitude and phase of channels 82 and 84 independently in the illustrated examples of FIGS. 2-4, the eccentricity, or degree of elliptical polarization (including linear, elliptical, and circular), is achieved at any given elliptic angle. In this manner, a linearly-, circularly-, or elliptically-shaped $B_1$ polarization field is generated according to a desired eccentricity which will optimize $B_1$ field uniformity.

To optimize transmit $B_1$ field uniformity for an object 96 positioned within the volume-of-interest 94, the $B_1$ polarization field may be acquired, evaluated, and adjusted, as known in the art. Additionally, the degree and orientation of the elliptical $B_1$ polarization field may be calculated with 3D simulations using numerical models. It is contemplated that the $B_1$ field map of object 96 can be determined using a scout scan, empirical data, or the like. For example, a B1 field map within the object being imaged can be acquired to determine the optimum settings for amplitude and phase and this optimized setting will improve the B1 uniformity within the object.

For an object 96 positioned within the volume-of-interest 94, optimization of the B1 field may be achieved by varying a phase shift between channel 82 and channel 84. Optimization of the $B_1$ field may also be achieved by varying a magnitude of channel 82 and/or channel 84 or by a combination of magnitude and phase shift variation.

For example, as shown in FIG. 3, a circular, highpass birdcage RF coil assembly 70 has a first channel 82 and a second channel 84 connected to end ring 72. A patient 96 is positioned within the RF coil assembly 70. To generate an elliptically polarized $B_1$ field oriented horizontally, the first and second channels 82, 84 are driven at equal amplitude but with a phase shift therebetween of less than 90 degrees. The first and second channels 82, 84 are driven with independent current or voltage controls. If driven with independent current controls, the first and second channels 82, 84 may be driven according to the equations:

$$I_1 = A\cos(2\pi ft) \quad \text{Eqn. 1, and}$$

$$I_2 = B\cos(2\pi ft + \Phi) \quad \text{Eqn. 2,}$$

where A and B are the amplitudes for the first and second channels 82, 84, respectively, and $\phi$ is the phase shift between the first and second channels 82, 84.

Thus, first and second channels 82, 84 may be elliptically driven such that, in the presence of subject 96, a uniform field may be generated. However, under high $B_1$ field strength, such as 3 T or greater, uniform $B_1$ polarization may not result because of the cumulative effect of inherent variability of components used to fabricate the coil and other components, and their effect once the coil is installed into the MR system. As a result, shading in the image may result.

Figure 5:
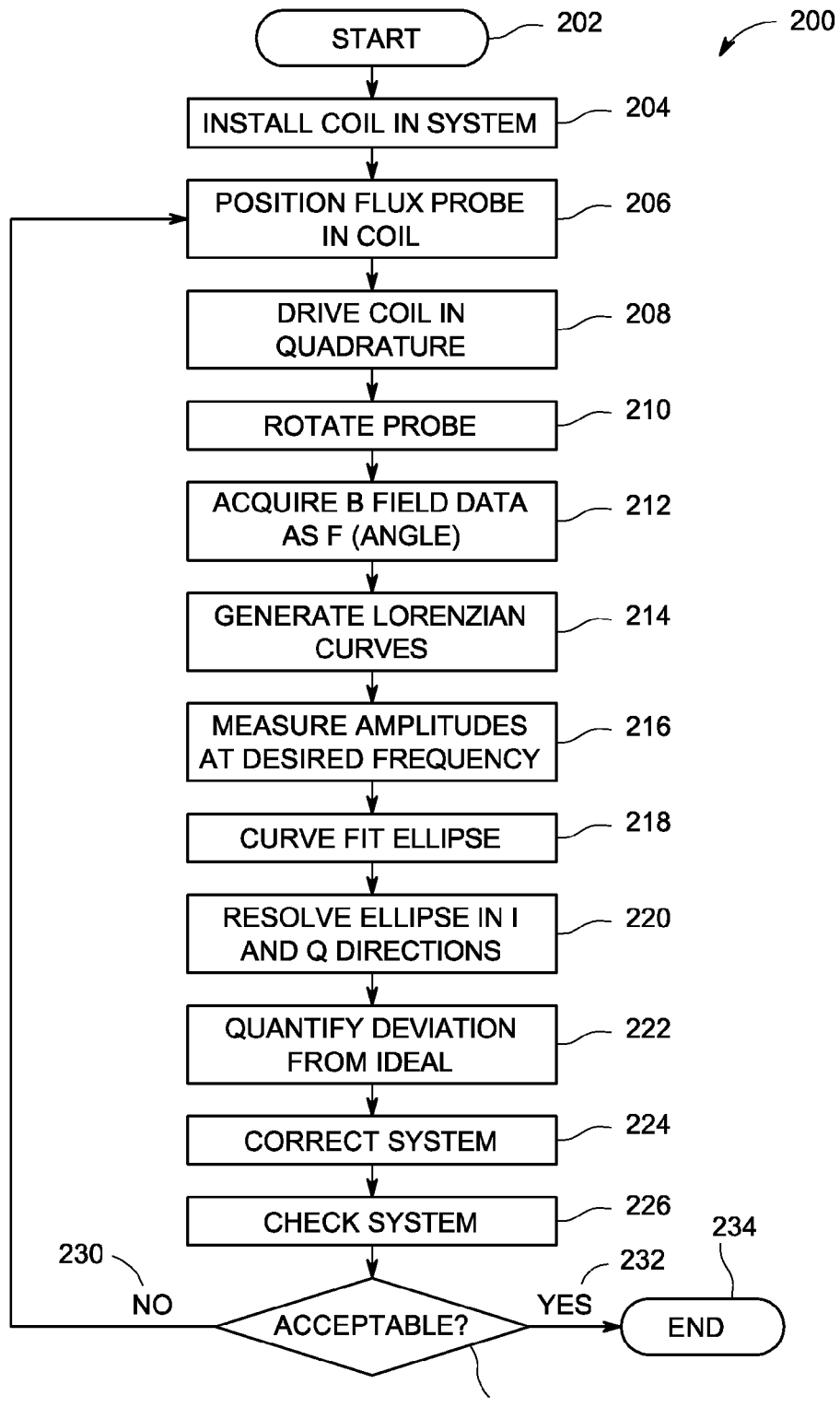
FIG. 5 illustrates a technique for calibrating an RF coil in an MRI system, according to an embodiment of the invention.

As such, an MRI system such as system 10 illustrated in FIG. 1 may be calibrated with RF coil 56 installed in gradient coil 50, and a uniform $B_1$ polarization may be achieved, according to the invention, such that shading in the image is minimized. Referring to FIG. 5, technique 200 starts at step 202 and an RF coil is installed into a gradient coil at step 204. At step 206 a flux probe is positioned within the RF coil using, for instance, a fixture that enables the flux probe to be rotated through 360° of rotation at generally an isocenter of the RF coil. In an alternate embodiment, multiple flux probes may be positioned within the RF coil and positioned having desired angles, precluding the need to rotate a single probe. Thus, referring back to FIG. 2 as an example, a single flux probe 77 may be positioned and angularly repositionable within RF coil assembly 70 without subject 96 therein, in order to characterize assembly 70. In an alternate embodiment, multiple probes 77 and 79 (only two illustrated) may be positioned at isocenter within assembly 70 at desired angles or orientations 81. In yet another embodiment referring to FIG. 3, multiple probes 83 (only two illustrated) may be positioned circularly near isocenter within assembly 70 at desired angles or orientations. The RF coil is driven in quadrature at step 208 using, for instance, an I and Q port such as that illustrated and discussed with respect to first and second channels 82, 84 in FIGS. 2-4 above. According to one embodiment of the invention, the RF coil is driven using components of system 10 that include console 12 and transceiver 58 and performed during manufacture or after site installation. However, according to another embodiment, the RF coil is driven using a device that is positioned proximate to system 10 of FIG. 1 and separate therefrom. That is, according to this embodiment, a device may be carried by a technician to a site of system 10 that is separate from system 10 and used to drive the RF coil assembly without having to use transceiver 58 of system 10.

Figure 6:
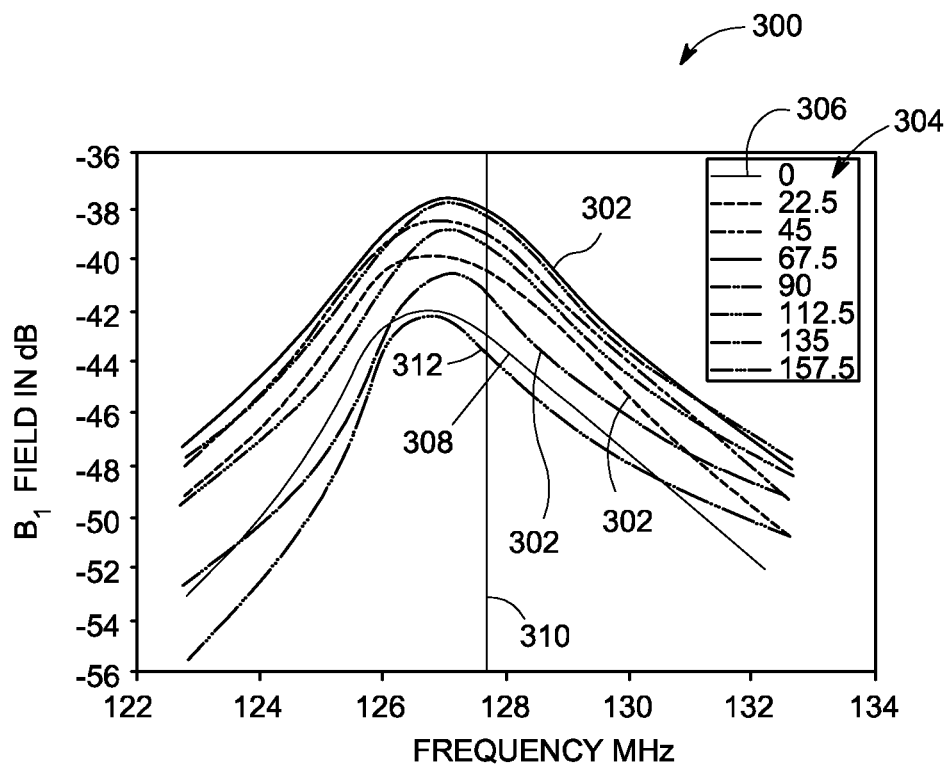
FIG. 6 illustrates a series of exemplary Lorentzian curves.

In the embodiment using one flux probe, the flux probe is rotated at step 210 and $B_1$ data is acquired at step 212. However, in the alternate embodiment where two or more flux probes are used, step 210 may not be performed and the flux probes may be positioned stationary at their desired angular position. The acquired $B_1$ data vs. frequency, taken in dB units, takes the form of a Lorentzian curve, several of which are illustrated in FIG. 6. Referring now to FIG. 6, plot 300 illustrates several curves 302 that correspond to respective measurement angles 304 of the flux probe. For instance, flux data acquired at zero degrees of probe orientation 306 corresponds to the Lorentzian curve at zero degrees of probe orientation 308. Once curves 302 are acquired, a corresponding amplitude at a desired frequency 310 is obtained for each curve 302. The desired frequency 310 is the Larmor frequency which, in one embodiment, is 127.72 MHz. Thus, curve 308 at zero degrees of orientation has an amplitude 312 at desired frequency 310.

Figure 7:
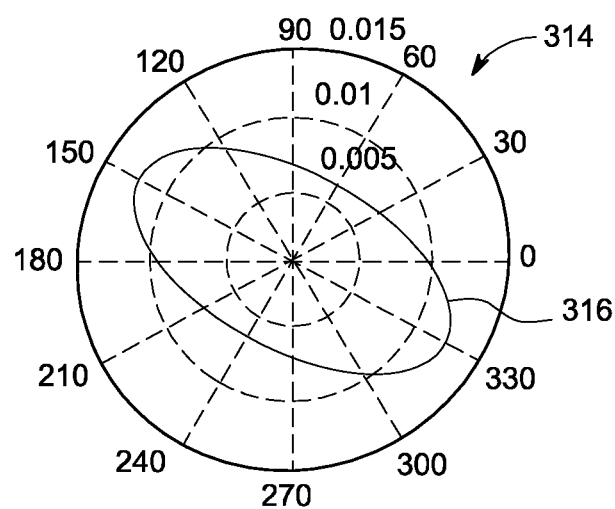
FIG. 7 illustrates an ellipse generated from Lorentzian curves at a desired frequency.

Referring now to FIG. 7, amplitude data obtained from curves 302 at desired frequency 310 is curve fit and plotted 314 in polar coordinates, corresponding to the measured amplitudes at respective probe orientations. Typically, plot 314 forms an ellipse 316 which, as known in the art, takes the form of:

$$\frac{x^2}{a^2} + \frac{y^2}{b^2} = 1, \quad \text{Eqn. 3.}$$

Figure 8:
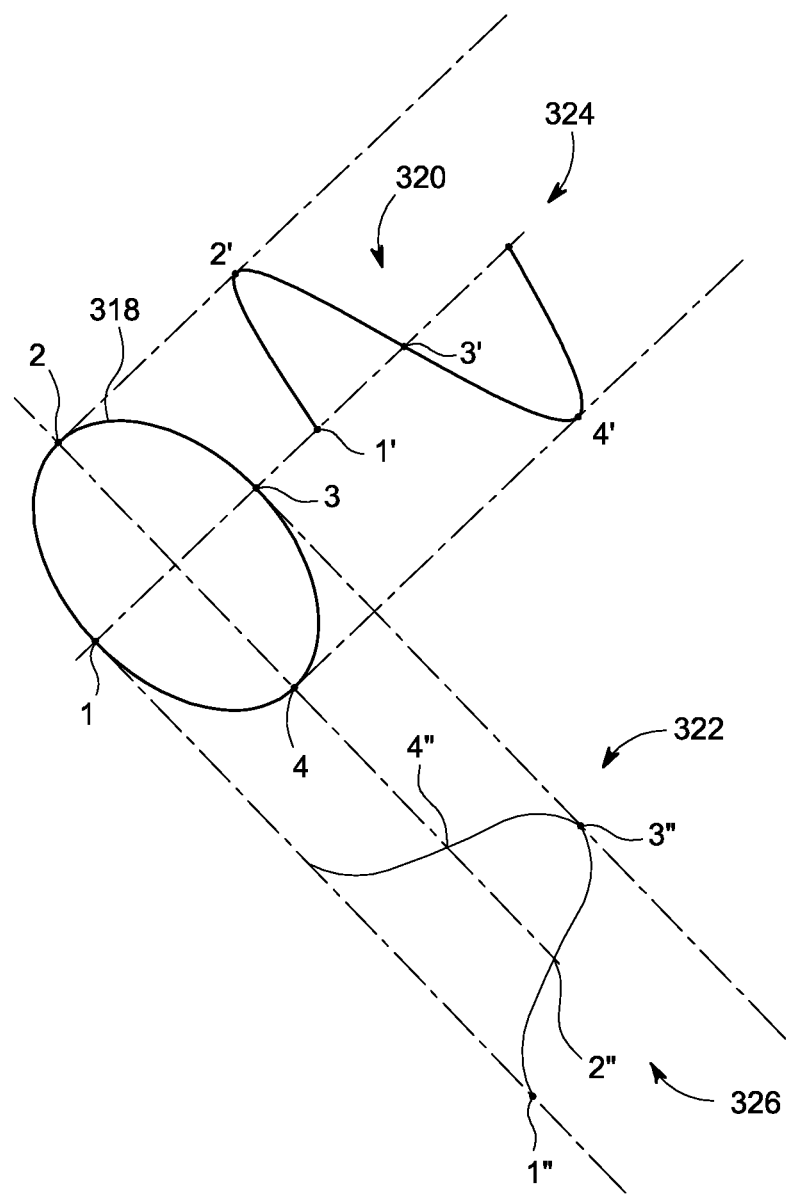
FIG. 8 illustrates generation of two offset sinusoidal inputs from an ellipse.

A number of ellipse curvefit algorithms are known in the art. For instance a least squares fitting algorithm may be employed to convert acquired data into the form of an ellipse. Once the mathematical expression of the ellipse is obtained, the ellipse is resolved into vectors in the direction of I and Q vectors, as shown in FIG. 8, according to the invention. Generally, one skilled in the art will recognize that two sinusoids of equal phase and magnitude will form a circle if 90° out-of-phase. It is also known that if the amplitudes of the two sinusoids are different an ellipse is formed, and if the sinusoids are out of phase different from 90° the ellipse will accordingly have its major and minor axes at an angle. Thus, an ellipse may be deconvolved into a magnitude and phase angle in order to describe the ellipse.

Referring now to FIG. 8 for illustration of this principle as it relates to system 10 and to the disclosed invention, ellipse 318 may be mathematically generated using a first sinusoid 320 and a second sinusoid 322 that are offset from one another by 90°. Analogously to system 10, the axes of the two sinusoids 320, 322 may correspond to, for instance, a Q channel 324 and an I channel 326 which likewise correspond to first and second channels 82, 84 of FIGS. 2-4 as described above. For illustration purposes, ellipse 318 is represented having points 1, 2, 3, and 4 that correspond to points 1', 2', 3', and 4' of sinusoid 320 and to points 1", 2", 3", and 4" of sinusoid 322.

Thus, it will be recognized by one skilled in the art that by applying an elliptical polarization (settings in dB and phase of which can be determined from a $B_1$ map). The two theoretical sinusoids, in other words, may be represented in an abbreviated and more general form, as an amplitude and a phase angle. That is, assuming two sinusoidal inputs having a 90° offset, an ellipse may be expressed as a magnitude and phase difference for the two sinusoidal inputs that would form the ellipse. Thus, an ellipse may be resolved into two mathematical values that may be simply expressed as a magnitude and phase difference, and applied in order to obtain a uniform $B_1$ field within a patient or object.

Referring back to FIG. 7, ellipse 316, having been formed from two ports 76, 78 as illustrated in FIGS. 2-4, offset from one another by 90° and having been generated from two input sinusoids, may be expressed as an amplitude and phase difference. And, knowing the amplitude and phase difference, such parameters may therefore serve as a correction factor or calibration factor that may be applied to input ports I and Q in order that a circular or uniform $B_1$ field is generated. In so doing, one skilled in the art will recognize that, upon implementation of the revised sinusoidal amplitudes and phase difference, a uniform $B_1$ field will result therefrom, and the amplitudes of curves 302 of FIG. 6 will likewise be very similar in magnitude at desired frequency 310.

Thus, referring back to FIG. 5 and technique 200 described therein, at step 214 Lorentzian curves are generated as a function of angular orientation of a flux probe within the RF coil, consistent with the description corresponding to FIGS. 6-8 above. Amplitudes are measured at step 216 at a desired frequency, which in one embodiment is the Larmor frequency and is 127.72 MHz. An ellipse is fit to the data at step 218, and resolved into I and Q directions at step 220. Once resolved into the I and Q directions, the ellipse is expressed as a magnitude and phase difference, or deviation from an ideal circular $B_1$ field, at step 222.

With the magnitude and phase difference, one skilled in the art will recognize that the system may be adjusted to correct 224 for the inherent system variances that caused the non-circular $B_1$ field to occur. For instance, capacitors about the RF coil may be individually replaced, capacitors about the RF coil may be variable capacitors and their capacitance may accordingly be adjusted, variable RF coil capacitance in a capacitor on the RF coil may be grossly adjusted, or the RF coil within the bore of system 10 may be shimmed or otherwise adjusted in position, as examples. In the case of adjusting a variable RF coil capacitance, variable capacitor can be located strategically with respect to the input ports such that adjusting the variable capacitors would cause predictable changes in the B1 polarization. In other words, known methods exist for effecting the capacitance of the RF coil which, according to the invention, may be adjusted based on the amount of deviation from ideal that is identified at step 222.

As such, additional benefits of the invention are that the measurements described herein can be done without significantly taking the system apart and, depending upon implementation approach, may in some instances be implemented without taking anything apart at all. Thus, troubleshooting at a customer site is improved. This is particular important when there is a drift in coil performance in terms of tuning or polarization due to movement of the coil within the shield when, for instance, a large patient pushes the coil onto one side.

The process illustrated in FIG. 5 may be repeated in subsequent iterations to further improve performance of system 10. Thus, the system is checked at step 226, which may include taking additional rotational measurements of the probe, to ensure the system is within specification 228 and the $B_1$ field is sufficiently uniform and circular. If not acceptable 230, the process may be repeated by returning to step 206 and re-quantifying the deviation from $B_1$ field circularity. However, if within specification and acceptable 232, the process ends 234 and the system is calibrated.

A technical contribution for the disclosed method and apparatus is that it provides for a computer implemented method of calibrating an MRI system and, more specifically for calibrating an RF coil when positioned within the MRI system.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

According to one embodiment of the invention, an MRI apparatus includes a magnetic resonance imaging (MRI) system having a plurality of gradient coils positioned about a bore of a magnet, an RF coil assembly having at least a first port and a second port, an RF transceiver system having a pulse module and configured to transmit RF signals to the first port and the second port, and a computer programmed to drive the RF coil assembly in quadrature through the at least first port and the second port, measure a $B_1$ field using at least one flux probe at two or more angular orientations within the RF coil assembly, and characterize and optimize performance of the MRI system based on the measurements of the $B_1$ field.

According to another embodiment of the invention, a method of characterizing and optimizing an RF coil for an MRI apparatus includes driving an RF coil assembly in quadrature, positioning one or more flux probes within the RF coil assembly, measuring a $B_1$ field of the RF coil assembly at two or more angular positions of the one or more flux probes within the RF coil assembly, and characterizing and optimizing performance of an MRI apparatus based on the measurements of the $B_1$ field of the RF coil assembly at the two or more rotational positions of the flux probe.

According to yet another embodiment of the invention, a non-transitory computer readable storage medium having stored thereon a computer program comprising instructions which when executed by a computer cause the computer to cause an RF transmitter to emit a magnetic field in quadrature from two ports of an RF coil assembly that is positioned within an MRI apparatus, obtain $B_1$ field data of the RF coil assembly from a flux probe that is positioned within the RF coil assembly at two or more angular positions of the flux probe, and determine a set of correction parameters for the MRI apparatus based on the obtained $B_1$ field data.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
    a magnetic resonance imaging (MRI) system having a plurality of gradient coils positioned about a bore of a magnet;
    an RF coil assembly having at least a first port and a second port;
    an RF transceiver system having a pulse module and configured to transmit RF signals to the first port and the second port; and
    a computer programmed to:
        drive the RF coil assembly in quadrature through the at least first port and the second port;
        measure a $B_1$ field using at least one flux probe at two or more angular orientations within the RF coil assembly; and
        characterize and optimize performance of the MRI system based on the measurements of the $B_1$ field.

2. The MRI apparatus of claim 1 wherein the computer is programmed to drive the RF coil assembly using one of the RF transceiver system of the MRI apparatus and an RF transceiver that is separate from the MRI apparatus.

3. The MRI apparatus of claim 1 wherein the computer is programmed to determine a correction factor to reduce a fluctuation of the $B_1$ field as a function of angular orientation of the flux probe based on the characterization and at a desired frequency.

4. The MRI apparatus of claim 1 wherein the computer is programmed to generate a Lorentzian curve of the $B_1$ field for each angular orientation at which the $B_1$ field is measured.

5. The MRI apparatus of claim 4 wherein the computer is programmed to determine an amplitude of each Lorentzian curve at a desired frequency of the MRI system.

6. The MRI apparatus of claim 5 wherein the desired frequency of the MRI system is a Larmor frequency of the MRI system.

7. The MRI apparatus of claim 5 wherein the computer is programmed to:
    generate an ellipse that is fit to amplitudes of each Lorentzian curve at the desired frequency; and
    determine an amplitude correction and a phase correction to apply to the MRI system or an RF coil assembly that is based on the ellipse.

8. A method of characterizing and optimizing an RF coil for an MRI apparatus comprising:
    driving an RF coil assembly in quadrature;
    positioning one or more flux probes within the RF coil assembly;
    measuring a $B_1$ field of the RF coil assembly at two or more angular positions of the one or more flux probes within the RF coil assembly; and
    characterizing and optimizing performance of an MRI apparatus based on the measurements of the $B_1$ field of the RF coil assembly at the two or more rotational positions of the flux probe.

9. The method of claim 8 comprising rotating one of the one or more flux probes within the RF coil assembly in order to measure the $B_1$ field angular distribution of the RF coil assembly at the two or more angular positions using the same flux probe.

10. The method of claim 8 wherein the step of characterizing and optimizing performance comprises determining a correction factor to be applied to the MRI apparatus that reduces an amount of fluctuation of the $B_1$ field as a function of an angular orientation of the flux probe, based on the characterized performance of the MRI apparatus.

11. The method of claim 10 wherein optimizing performance of the MRI apparatus based on the determined correction factor comprises one or a combination of:
    positioning a shim between the RF coil assembly and an inner bore in which the RF coil assembly is positioned;
    changing capacitance of one or more capacitors in the RF coil assembly;
    changing a capacitance of a variable capacitor that is coupled to a body of the RF coil assembly; and
    repositioning a coil within the RF coil assembly.

12. The method of claim 8 comprising generating a Lorentzian curve of the $B_1$ field for each of the two or more rotational positions of the flux probe at which the $B_1$ field is measured.

13. The method of claim 12 comprising:
    identifying a desired frequency of the MRI system at which the MRI apparatus is to be characterized; and
    measuring an amplitude of each Lorentzian curve at the desired frequency.

14. The method of claim 13 comprising:
    generating an ellipse that is based on the measured amplitude of each Lorentzian curve; and
    characterizing the performance of the MRI apparatus or the RF coil assembly by generating an amplitude correction and a phase correction to apply to the MRI apparatus that is based on the ellipse.

15. A non-transitory computer readable storage medium having stored thereon a computer program comprising instructions which when executed by a computer cause the computer to:
    cause an RF transmitter to emit a magnetic field in quadrature from two ports of an RF coil assembly that is positioned within an MRI apparatus;
    obtain $B_1$ field data of the RF coil assembly from a flux probe that is positioned within the RF coil assembly at two or more angular positions of the flux probe; and
    determine a set of correction parameters for the MRI apparatus based on the obtained $B_1$ field data.

16. The computer readable storage medium of claim 15 wherein the computer is programmed to determine the set of parameters such that a fluctuation of a $B_1$ field is reduced at a desired frequency as a function of an angular orientation of the flux probe.

17. The computer readable storage medium of claim 15 wherein the computer is programmed to generate a Lorentzian curve of a $B_1$ field for each angular orientation at which the $B_1$ field is measured.

18. The computer readable storage medium of claim 17 wherein the computer is programmed to determine an amplitude of each Lorentzian curve at a desired frequency of the MRI system.

19. The computer readable storage medium of claim 18 wherein the desired frequency of the MRI system is a Larmor frequency of the MRI system.

20. The computer readable storage medium of claim 18 wherein the desired frequency of the MRI system is 127.72 MHz.

21. The computer readable storage medium of claim 18 wherein the computer is programmed to:
- generate an ellipse that is fit to the amplitudes of each Lorentzian curve at the desired frequency; and
- determine an amplitude correction and a phase correction to apply to the RF coil assembly that is based on the ellipse.

\* \* \* \* \*